United States Patent [19]
Burgher et al.
[11] Patent Number: 5,051,867
[45] Date of Patent: Sep. 24, 1991

[54] TRANSFORMER ASSEMBLY WITH EXPOSED LAMINATIONS AND HOLLOW HOUSINGS

[75] Inventors: Peter H. Burgher, Captiva, Fla.; John Boomer, Howell, Mich.
[73] Assignee: Marelco Power Systems, Inc., Howell, Mich.

[21] Appl. No.: 540,198
[22] Filed: Jun. 19, 1990

Related U.S. Application Data

[63] Continuation-in-part of Ser. No. 349,705, May 10, 1989, Pat. No. 4,956,745.

[51] Int. Cl.[5] .................. H05K 7/20
[52] U.S. Cl. .................. 361/383; 307/150; 336/98; 336/105; 361/380; 361/394
[58] Field of Search .................. 307/150; 336/98, 105, 336/107; 361/332, 380, 383, 384, 392, 394, 395, 399

[56] References Cited

U.S. PATENT DOCUMENTS

| | | | |
|---|---|---|---|
| 1,708,361 | 4/1929 | Douglas | 336/98 |
| 2,625,591 | 1/1953 | George | 361/332 |
| 2,815,491 | 12/1957 | Antalis et al. | 336/98 |
| 3,011,139 | 11/1961 | Dierstein | 336/98 |
| 3,810,057 | 5/1974 | Franz et al. | 336/98 |
| 4,872,102 | 10/1989 | Getter | 361/383 |

*Primary Examiner*—Gregory D. Thompson
*Attorney, Agent, or Firm*—Brooks & Kushman

[57] ABSTRACT

A transformer assembly (10) for use as a self-contained auxiliary power supply in complex machine tool applications is disclosed as having a core (16) with a first side (18) and a second side (20). Attached to the first side (18) of the core (16) is a first hollow housing (30). A second hollow housing (34) is attached to the second side (20) of the core (16). The core (16) has lateral side edges (28) extending between the first and second sides (18, 20) thereof for effective removal and dissipation of heat generated by the transformer assembly (10). A plurality of electrical components (38) are mounted at least partially within one or more of the hollow housings (30, 34) to provide compact accommodation of the electrical components (38) by the transformer assembly (10) so that the latter occupies a minimal volume within a control panel in the complex machine tool. Accordingly, the assembly so described is significantly smaller and less costly than conventional auxiliary power supplies. In one embodiment of the invention, multiple sets of cores (16) are disposed adjacent to each other and have common hollow housings (30, 34) on the first and second sides (18, 20) respectively. This embodiment isolates the output of the respective transformer secondary windings. In another embodiment, two sets of cores (16, 16′) are joined by a common hollow housing (34). Additional housings (30) are provided on the distal sides (18, 18′) of the cores (16, 16′). This configuration is suitable for use in spaces that are long and narrow and has an enhanced ability to dissipate heat, even when mounted within confined enclosures.

25 Claims, 7 Drawing Sheets

Fig. 1
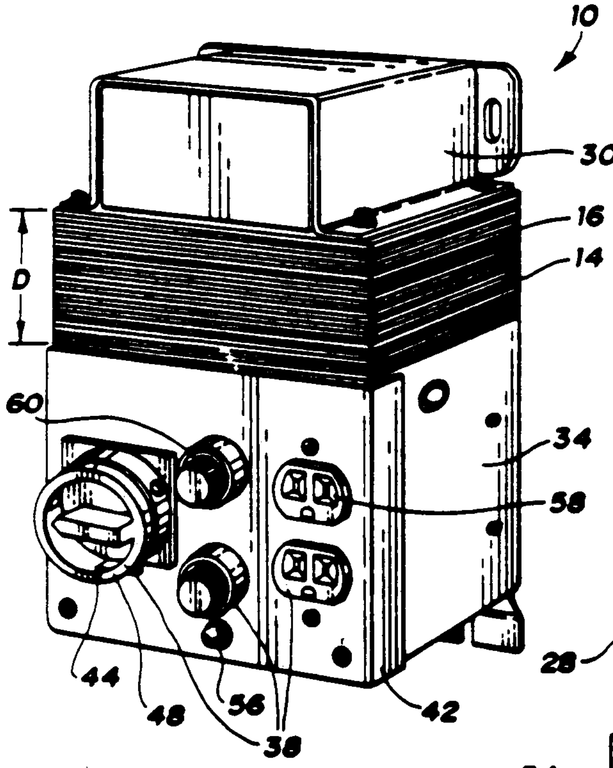
Fig. 2
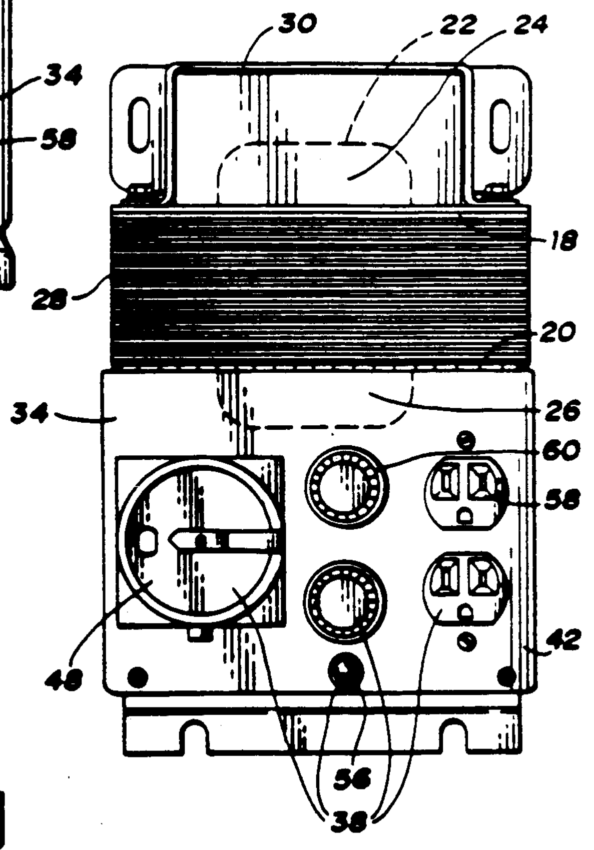
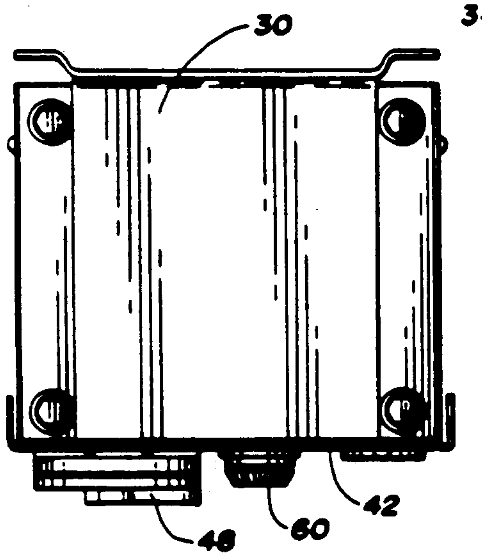
Fig. 3

Fig. 4
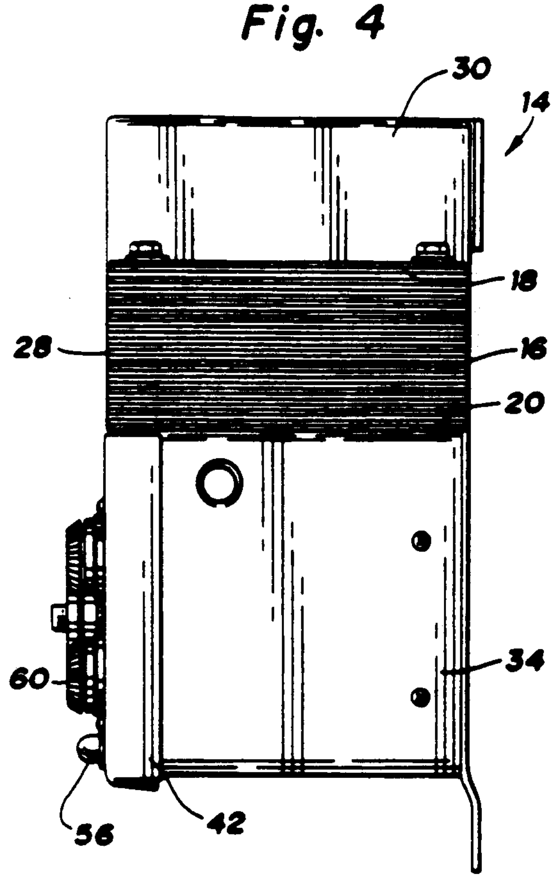
Fig. 5
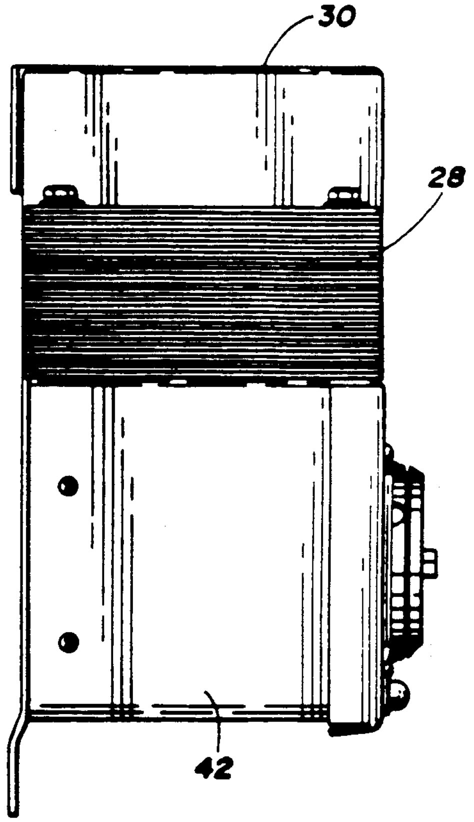
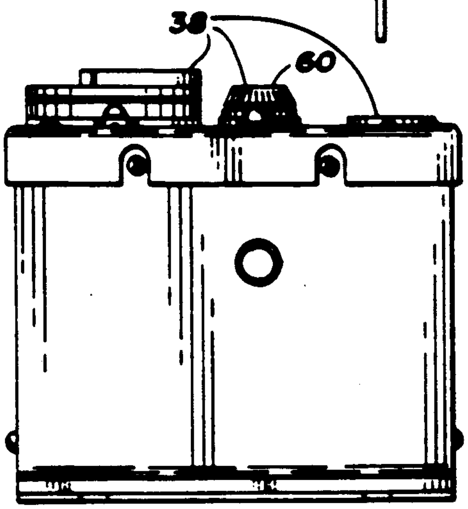
Fig. 6

Fig. 7
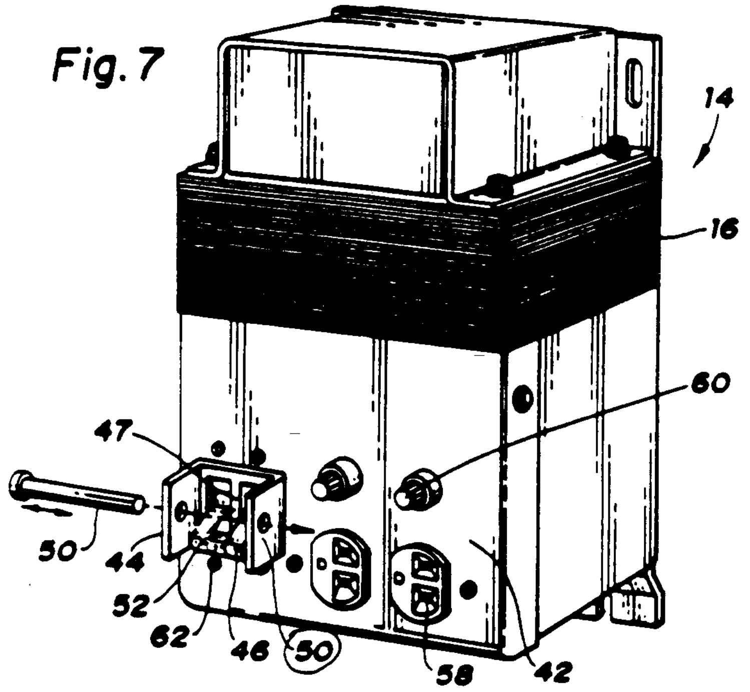
Fig. 8
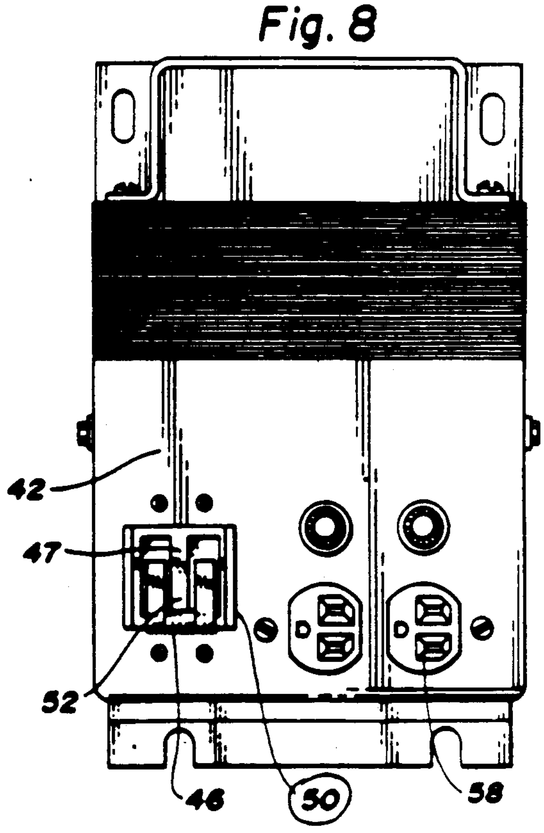
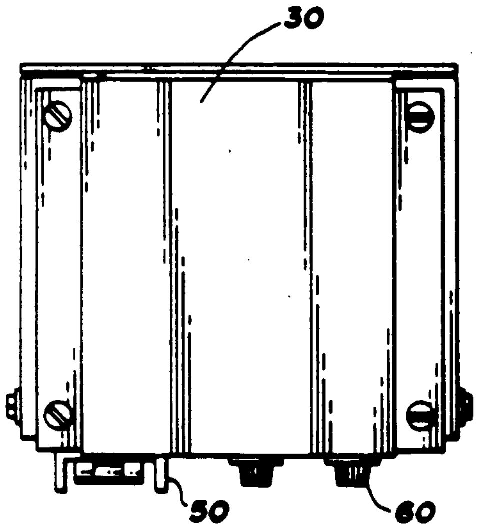
Fig. 9

TRANSFORMER ASSEMBLY WITH EXPOSED LAMINATIONS AND HOLLOW HOUSINGS

CROSS-REFERENCE TO RELATED APPLICATION

This application is a continuation-in-part of a prior application Ser. No. 349,705, filed May 10, 1989 U.S. Pat. No. 4,956,745.

TECHNICAL FIELD

This invention relates generally to electrical transformers. More particularly, the invention relates to a construction of a transformer assembly for use in a complex industrial application such as machine tooling. The transformer assembly includes a core of a transformer which has lateral side edges exposed beyond hollow housings attached to the core.

BACKGROUND ART

Step-down transformers have been used for many years as electrical power was harnessed in manufacturing processes. Such transformers are often used to reduce a line voltage associated with a main power supply in an industrial application to levels applicable to equipment connected to an output side of the transformer. In the United States, it is common to step down a main power supply of 480 volts down to about 120 volts, which is the voltage required for powering numerous accessories such as lights, electric hand tools, instruments, mini-computers, inspection lamps, and the like.

In the design of a large machine tool, machine device, or machine system in an industrial setting, the need frequently arises for auxiliary power to be available when the main power supply is disconnected or turned off. The auxiliary power may then be used to furnish a supply of secondary, stepped-down electrical power to the associated accessories. Devices designed to provide such auxiliary power are commonly referred to as auxiliary power supplies or lighting disconnects. Their application is found extensively in machines and machine tools used in the automotive industry, as well as other industries.

Auxiliary power supplies, including transformer assemblies, have been manufactured and used for some time. They generally include a container into which, for example, a transformer, fuses, wiring, and terminal boards are placed. A rotary or other type of switch is generally installed in the container with a handle extending through the container. In operation, if a cover of the container is opened, power from the auxiliary power supply is disconnected in much the same way as power is interrupted by the opening of doors on a main panel associated with the main power supply.

However, auxiliary power supplies available in the past leave unsolved the problem of bulk because they can be accommodated only with difficulty within the scarce space which is available in typical machine tool control panels. The layout of machine tools, machines, and industrial processing equipment frequently includes control panels within which are accommodated auxiliary power supplies. Often, the machine designer has difficulty in finding a place to install the auxiliary power supply, even though specified by a customer. This is because panel space is expensive and the plethora of increasingly complicated devices which must be contained within the control panel compete for the scarce amount of space available. There is therefore an unmet need for an auxiliary power supply which is smaller, more compact, and more useful than the devices generally available in the past. It would therefore be useful to have an auxiliary power supply which is small and compact, thereby facilitating its accommodation in the complex machine tool environment.

Under traditional approaches such as described above, auxiliary power supplies are mounted within the container which is located in the confines of the machine tool control panel. This configuration generates heat which is difficult to dissipate because of the proximity of numerous electrical components outside and within the container. As a result, ambient temperatures rise, the electrical integrity of various components becomes jeopardized, and eventually any insulation system associated with the transformer assembly begins to break down. A need has therefore arisen for a transformer assembly which, besides being compact, is so constructed that heat may readily be dissipated from exposed portions of a core so that operating temperatures are maintained within acceptable limits.

Under traditional approaches, in addition to the transformer, a number of electrical components such as receptacles, fuses, switches, and the like are mounted at least partially within the container which envelopes the transformer assembly. Besides requiring a relatively large amount of space within the control panel in the machine tool environment, conventional configurations do not allow ready dissipation of heat because of confinement by the container of the transformer assembly. To solve this problem, it would be desirable to dispense with the container and its associated electrical components and have a stand-alone transformer assembly including hollow housings mounted on an exposed core, the housing including electrical components mounted at least partially within at least one housing. In this way, the space occupied by the transformer assembly is kept to a minimal amount, while providing for ready dissipation of heat by the exposed portions of the core.

The concept of attaching a hollow housing over exposed coils and wiring associated with input and output requirements of the transformer have been known for many years. Illustrative is U.S. Pat. No. 3,810,057 issued to Franz, et al. Many transformer manufacturers offer standard models with end covers or caps. Such covers are cup-like shaped objects which extend from the core of a transformer around the exposed coils and associated wiring. However, such approaches usually involve the end caps covering at least part of the cover, thereby leaving unsolved the problems and adverse consequences of heat build-up due to ineffective cooling of the coils of the transformer.

DISCLOSURE OF INVENTION

An object of the present invention is to provide an improved transformer assembly having advantages which were not heretofore possible. The present invention contemplates mounting a plurality of electrical components, such as switches, controls, fuses, terminal blocks, and the like at least partially within one or more hollow housings which are attached to the ends of a core of a transformer. The resulting transformer assembly is free-standing in that it is not enveloped by a container on which the plurality of electrical components is mounted.

Accordingly, a transformer assembly is disclosed for providing a source of auxiliary electrical power independent of a main power supply. The transformer assembly comprises a transformer having a core including a first side and a second side opposite thereto. Also included is a coil with a first portion protruding outwardly from the first side of the core and a second portion protruding outwardly from the second side of the core. Extending between the first and second sides of the core are lateral side edges for facilitating the removal of heat generated by the transformer.

Attached to the first side of the core and extending over the first portion of the coil is a first hollow housing. A second hollow housing is attached to the second side of the core and extends over the second portion of the coil. A plurality of electrical components is mounted at least partially within one or more of the housings to provide compact accommodation of the electrical components by the transformer assembly.

The objects, features, and advantages of the present invention are readily apparent from the following detailed description of the best mode for carrying out the invention when taken in connection with the accompanying drawings.

BRIEF DESCRIPTION OF DRAWINGS

FIG. 1 is a front right perspective view illustrating the transformer assembly of the present invention;

FIG. 2 is a front view of the transformer assembly;

FIG. 3 is a top view of the transformer assembly;

FIG. 4 is a right side elevational view of the transformer assembly;

FIG. 5 is a left side elevational view of the transformer assembly;

FIG. 6 is a bottom view of the transformer assembly;

FIG. 7 is a front right perspective view of an alternate embodiment of the transformer assembly;

FIG. 8 is a front view of an alternate embodiment of the transformer assembly;

FIG. 9 is a top view of an alternate embodiment of the transformer assembly;

BEST MODE FOR CARRYING OUT THE INVENTION

Figure 10:
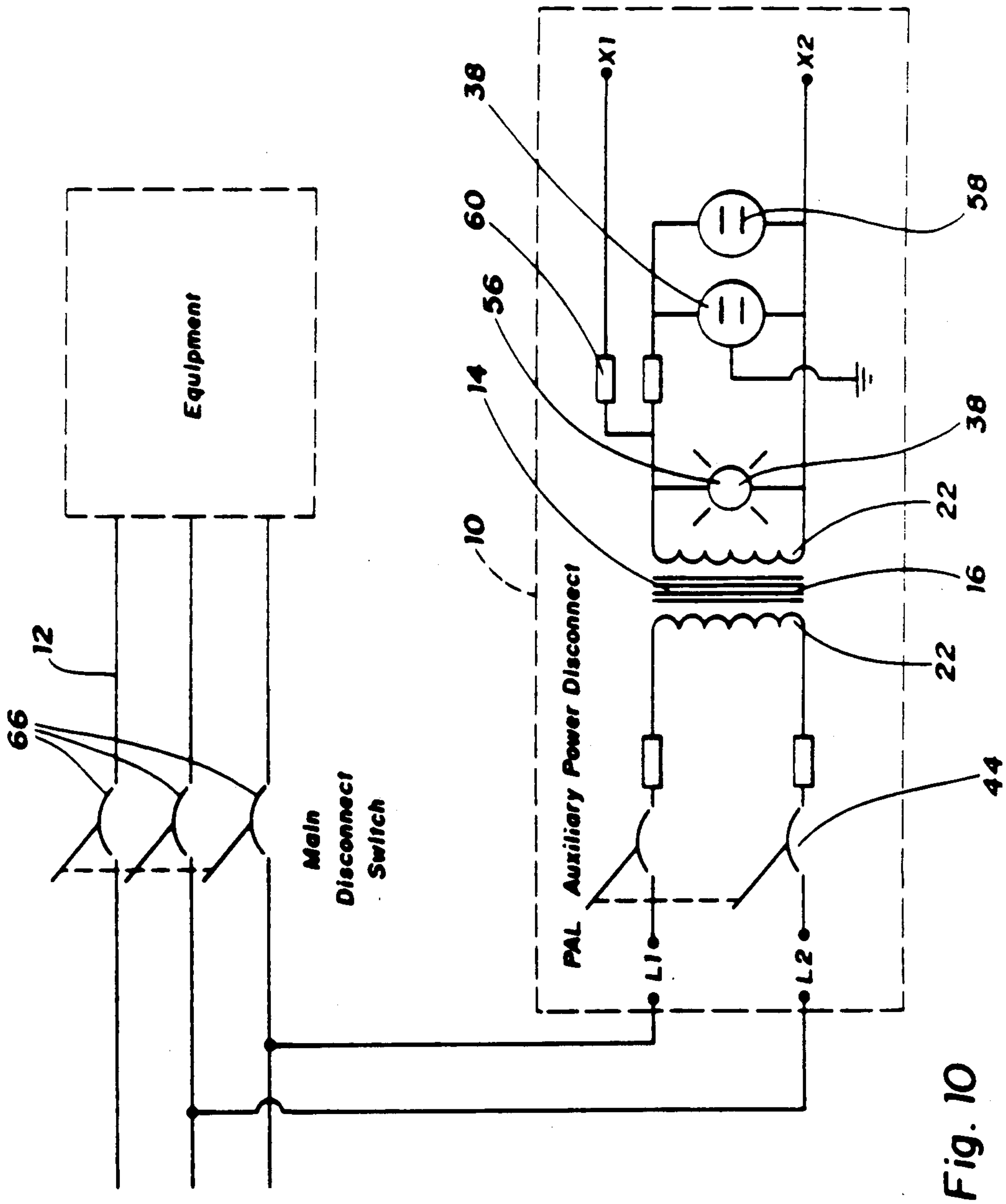
FIG. 10 is a schematic circuit diagram of the transformer assembly, showing its connection to a main power supply.

With reference to FIGS. 1–3 and 10 of the drawings, an improved transformer assembly constructed in accordance with the present invention is generally indicated by the reference numeral 10. This transformer assembly 10 is used to provide a source of auxiliary electrical power independent of a main power supply 12. The transformer assembly 10 includes a transformer 14 having a core 16, including a first side 18 and a second side 20 opposite thereto. Also included in the transformer 14 is a coil 22 which is indicated by a broken line in FIG. 2. The coil 22 includes a first portion 24 protruding outwardly from the first side 18 of the core 16 and a second portion 26 protruding outwardly from the second side 20 of the core 16. Lateral side edges 28 of the core 16 extend exposed between the first and second sides 18, 20 thereof for facilitating the removal of heat generated by the transformer 14.

Attached to the first side 18 of the core 16 and extending over the first portion 24 of the coil 22 is a first hollow housing 30. On the opposite side of the transformer 14 is a second hollow housing 34 which is attached to the second side 20 of the core 16. The second hollow housing 34 extends over the second portion 26 of the coil 22.

In one embodiment of the invention, a plurality of electrical components 38 are mounted at least partially within the first hollow housing 30 to provide compact accommodation therewithin by the transformer assembly 10. In another embodiment of the invention, the plurality of electrical components 38 are mounted at least partially within the second hollow housing 34. In another embodiment of the invention, the plurality of electrical components 38 are mounted at least partially within both the first and the second hollow housings 30, 34.

Figure 11:
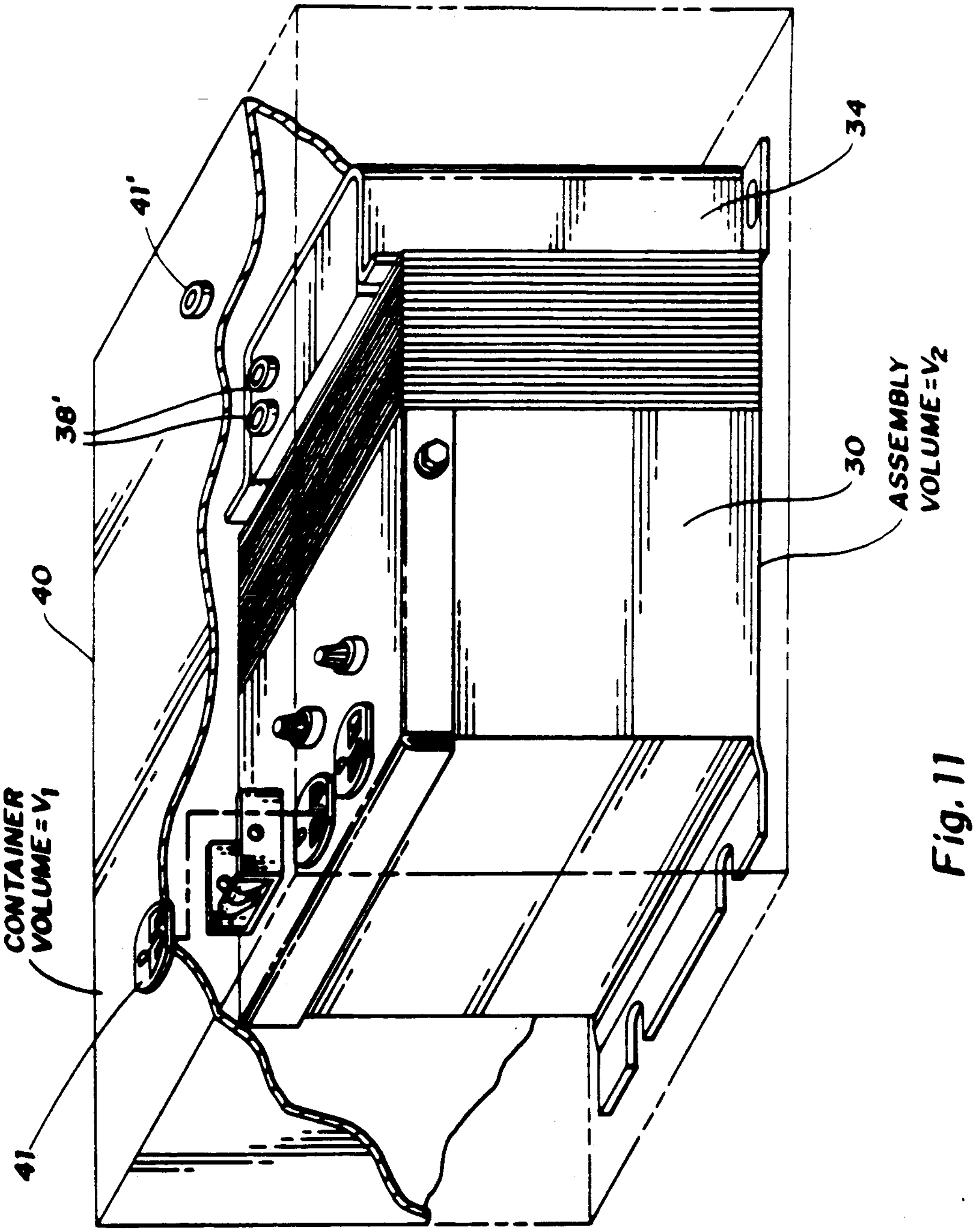
FIG. 11 is a perspective partially open view of a container housing having the transformer assembly.

Each embodiment of the transformer assembly 10 disclosed thus far contemplates the exposure of lateral side edges 28 of the core 16 which extend between the first and second sides 18, 20 thereof. By virtue of the lateral side edges 28 being unencumbered by the hollow housings 18, 20 or by a container 40 including electrical components 41, 41' mounted at least partially therein in FIG. 11, the lateral side edges 28 provide a ready means for heat dissipation from the transformer 14 and transformer assembly 10.

Because the electrical components 38, 38' are accommodated within either or both of the hollow housings 30, 34, respectively, rather than being mounted within a container 40 which envelopes the transformer assembly 10, the transformer assembly 10 is significantly smaller and therefore occupies proportionately less control panel space within a machine tool assembly. Because the transformer assembly 10 is not accommodated within the container 40, the transformer assembly 10 is cooled more efficiently and does not dissipate heat into the confined container 40.

Suppose that the transformer assembly 10 and a plurality of electrical components 38 mounted at least partially within the one or more hollow housings 30, 34 occupy an assembly volume [$V_2$]. Suppose further that the volume of the container 40 is expressed as $V_1$, where the container volume $V_1$ includes the transformer 14, the hollow housings, 30, 34, and electrical components 38 mounted at least partially within the container 40. Expressed in terms of spatial relationship, up to three times the assembly volume $V_2$ equals the container volume $V_1$.

The transformer assembly 10 of the present invention is inherently more flexible from a design point of view than conventional auxiliary power supplies which have the electrical components 38 accommodated within the container 40. Where the electrical components 38 include, for example, an inspection light, a receptacle, fuses 60 for primary or secondary sides of the transformer 14, these electrical components 38 and other ancillary devices can be mounted at least partially within either or both hollow housings 30, 34. The resulting configuration is readily accessible as compared to conventional configurations in which such components 38 are mounted within the container 40.

Either hollow housing 30, 34 preferably includes a cover 42 detachably connected thereto for access to the plurality of electrical components 38. In a preferred embodiment, by being hingedly connected to one or more of the hollow housings 30, 34, the cover 42 provides easy access to the transformer assembly 10 for internal wiring and fuse maintenance. In one embodiment of the invention, a means for stopping is associated with the cover 42 so that the pivotal movement of the cover 42 is impeded beyond 90 degrees of rotation. This feature reduces travel of the access cover 42, thereby eliminating interference with other components within the control panel associated with the main power supply 12. It should be understood that the cover 42 may also be mounted on an end of either the first, the second, or both of the hollow housings 30, 34 so that access to the transformer assembly 10 is available through the top or through the bottom of the assembly 10. This feature has proven useful where there is insufficient clearance outside the lateral side edges of the transformer assembly 10. To secure the cover 42 in a closed position, one or more fasteners may be used.

Typically included in the plurality of electrical components 38 are one or more means for switching for turning on or off the main power supply 12 to the transformer assembly 10. In one embodiment of the transformer assembly 10, the switching means comprises one or more circuit breakers 46, as best illustrated in FIGS. 7–9. In use, the circuit breakers 46 cooperate with the associated cover 42 by means of one or more tabs or fingers 47 so that the circuit breakers 46 turn off the main power supply 12 for safety upon opening the cover 42. In practice, this safety feature is enabled by means for deactivating 52 such as the tab or tabs 47 which engage either a bar 62 connecting adjacent circuit breakers 46 or the arms of the breakers themselves 46. The bar 62 is engaged by the deactivating means 52, such as the tab or a strip of metal when the cover 42 is opened. When the tab 47 comes into contact with the bar 62, the bar 62 and associated circuit breakers 46 are then tripped from the second ("on") to the first ("off") state. In this way, an attempted opening of the cover 42 will always turn off the main power supply. Also, it has been found that the deactivating means 52 may usefully comprise a strip which underlies each circuit breaker 46, instead of the bar 62. Following this teaching, the circuit breakers 46 are tripped when the cover 42 is opened by upward pressure exerted on each circuit breaker 46 when the cover 42 opens.

As best illustrated in FIG. 7, the transformer assembly 10 also includes means for locking 50 the one or more circuit breakers 46 in the first or second operating state. For example, the means for locking 50 includes a pair of flanges which extend outwardly from the cover 42. The locking means 50 also prohibit entry into the transformer assembly 10 whenever the locking means 50 is installed. Each flange includes an aperture. A device such as a padlock or lockable safety pin may be inserted between the apertures, the padlock or safety pin straddling the underlying circuit breakers 46. In this way, the circuit breakers 46 are secured by the locking means 50 in either the "on" or the "off" position. Further, the locking means 50 can be inserted with the cover 12 open, thus prohibiting the device 10 from being turned on and the cover 42 from closing.

Referring now to FIGS. 1–6, one or more of the means for switching 44 comprise one or more rotary switches 48 (only one shown). Each rotary switch 48 has a first ("off") and a second ("on") operating state. The one or more rotary switches 48 cooperate with the associated cover 42 so that they turn off the main power supply when in the first operating state for safety upon opening the cover 42. When one or more of the rotary switches 48 is in the second operating state ("on") and the main power supply is energized, the one or more rotary switches 48 cooperate with one or more of the plurality of electrical components 38 mounted at least partially within the associated hollow housing 30, 34 so that the cover 42 prohibits access into the associated hollow housing 30, 34 by a human operator. In this way, the transformer assembly 10 provides optimal safety and protection features by precluding a human operator from opening the cover 42 and coming into contact with a live source of electrical energy.

Turning back now to FIGS. 1–2, it can be seen that the plurality of electrical components 38 include one or more illumination devices 56 which are visible outside the cover 42. The one or more illumination devices 56 are turned on whenever electrical energy flows through the coil 22. As is apparent to those familiar with the art, the coil 22 may comprise primary and secondary windings. It has proven useful to connect the illumination device 56 to the primary, or to the secondary, so that whenever current flows through the associated winding, the illumination device 56 is activated. This feature provides an effective status indicator to an observer outside the transformer assembly 10.

In FIG. 1, the reference letter [D] symbolizes the distance between the first and second sides 18, 20 of the core 16. The distance [D] represents the height of the lateral side edges 28 of the core 16. Inherent within each transformer assembly 10 is an electrical capacity rating which is determined, in part, by the number of laminations which are stacked to comprise the core 16. The rating, for example, is increased by adding laminations, and is decreased by using fewer laminations in the core 16. A family of transformer assemblies 10 can be built using the same first hollow housing 30 and second hollow housing 34 because the only dimension which changes in the transformer assembly 10 affecting the assembly of the auxiliary power supply is the distance [D]. Since the distance [D] of the core is the only dimension which changes, the entire transformer assembly 10 of each member of a family of transformer assemblies 10 can be received, if desired, within the container 40. Thus, the container 40 of a given cross section can be constructed, if desired, to accommodate any member of the family of transformer assemblies 10. Extending dimension D by adding laminations to supplement electrical capacity will also affect the size and length of the transformer coils contained therewithin, a necessary concomitant of increased electrical rating.

In making the transformer assembly 10 of the present invention, it has been found useful to select the plurality of electrical components 38 which are mounted at least partially within the one or more hollow housings 30, 34 from a group consisting of one or more illumination devices 56, receptacles 58, fuses 60, switching means 44, shielding means, electrical noise protection means, surge protection means, ground fault protection means, switch mounting means, and terminal blocks. In practice, it has been found that the means for shielding provide additional isolation between primary and secondary windings of the transformer assembly 10, or between such windings together and the core 16 of the transformer 14, thus reducing line noise and interference. Alternate embodiments of the transformer assembly 10 include the electrical components 38 being mounted either completely within the associated hollow housing 30, 34, mounted therethrough, or mounted thereon.

In practice, one of the fuses or sets of fuses 60 may be associated with a primary winding, and another fuse or sets of fuses 60 with a secondary winding. The receptacles 58 may be of the type which are typically rated at 120 volt, 15 amps, or other ratings which meet the needs of the user, and are grounded. Additionally, one or more fuses 60 may also be mounted within one or more of the hollow housings 30, 34.

As disclosed earlier, because the lateral side edges 28 are exposed between the sides 18, 20 of the core 16, the transformer assembly 10 is operated at a capacity level that has a relatively low increase in temperature under operating conditions. This feature allows the transformer assembly 10 to handle up to 40 percent more current before reaching an overload condition than is available with transformer assemblies typically employed in auxiliary power supplies.

It is desirable to be able to draw as much current as possible from the secondary winding of a given transformer without exceeding an acceptable temperature range. Listed below are the maximum secondary amperages which may be drawn from each transformer assembly when operated under different temperature rise classifications. For comparison, corresponding amperages [under prior art approaches] are also shown:

| Typical Transformer | Maximum Secondary Amperage | | | | Memo: Prior Art |
|---|---|---|---|---|---|
| Assembly Embodiment Number | Class A 55° C. | Class B 80° C. | Class F 115° C. | Class H 150° C. | Class H (+/−10%) |
| 1 | 4.17 | 6.58 | 6.93 | 7.83 | 4.17 |
| 2 | 6.25 | 9.54 | 11.44 | 12.95 | 6.25 |
| 3 | 8.34 | 10.53 | 12.65 | 14.31 | 8.34 |
| 4 | 12.50 | 16.34 | 19.89 | 22.68 | 12.50 |
| 5 | 16.70 | 23.50 | 28.50 | 32.83 | 16.70 |
| 6 | 25.00 | 32.92 | 40.21 | 45.93 | 25.00 |

Under operating conditions, it has been found that unlike other assemblies previously known, the transformer assembly 10 of the present invention may be operated at higher than rated temperatures without harm because of the superior heat dissipation feature associated with having exposed lateral side edges 28 between the sides 18, 20 of the core 16. Superior heat dissipation also occurs because the transformer assembly 10 is not placed inside the larger container 40 with other electrical components 38 mounted within the container 40.

By constructing the transformer assembly 10 as disclosed herein, the transformer assembly 10 is significantly smaller, and is more compact, than transformer assemblies previously known. By virtue of the compact nature of Applicant's transformer assembly 10, far less panel space is needed, thereby promoting increased efficiency and space utilization. The switching means, the locking means, and the deactivation means provide features which contribute to operational safety and convenience in use.

Turning again to FIG. 10, it can be seen that the transformer assembly 10 of the present invention may be used in connection with the main power supply 12 wherever an auxiliary independent power supply is needed. The transformer assembly 10 is wired directly to the line side of a main power supply panel disconnect switch 66. The transformer assembly 10 provides auxiliary power at any time, regardless of whether the main power supply disconnect switch 66 is in the "on" or "off" position.

As mentioned earlier, circuit breakers 46 can be used as the means for switching 44. Such circuit breakers 46 replace conventional mechanical disconnect switches. Applicant's magnetic circuit breaker 46 proivdes additional circuit overload protection where a fuse of higher-than-recommended amperage is installed. The magnetic circuit breaker 46 prevents unnecessary blowing of fuses 60 if the transformer assembly 10 is improperly installed. If the transformer assembly 10 is improperly wired to the main power supply circuit, the magnetic circuit breaker 46 will "trip" before the fuses 60 are blown.

Often associated with the one or more hollow housings 30, 34 are means for accommodating conduits or ducting, such as knock-outs, to permit wires and cables to connect the primary winding of the transformer assembly 10 to, for example, the main power supply 12. The means for ducting might also connect, for example, the secondary winding of the coil 22 to such auxiliary devices as a computer terminal and the like.

Figure 12:
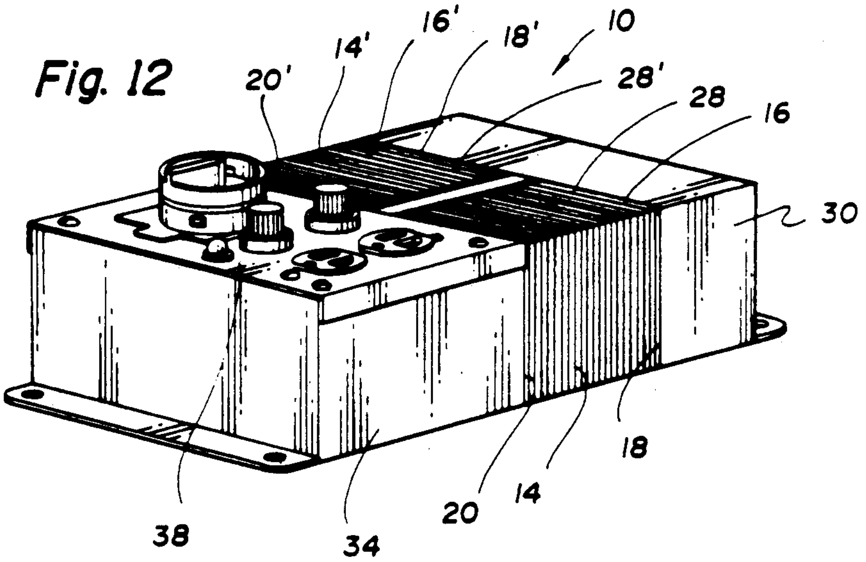
FIG. 12 is a perspective view of a second alternate embodiment of the transformer assembly.

Turning now to FIG. 12, there is depicted an alternate embodiment of the invention wherein the transformer assembly 10 comprises two transformers 14, 14' disposed in a side-by-side relationship. The transformers have cores 16, 16' including first sides 18, 18' and second sides 20, 20' opposite thereto. A coil (not shown) in each transformer protrudes includes first and second portions which protrude outwardly respectively from the first and second sides of the cores 16, 16'. The cores 16, 16' include lateral side edges 28, 28' extending between the first 18, 18' and second 20, 20' sides for facilitating the removal of heat generated by the transformers 14, 14'.

Continuing with reference to FIG. 12, there is shown a first hollow housing 30 which is attached to the first side 18, 18' of the cores 16, 16' so that one housing 30 is common to the cores 16, 16'. Extending over the second portions of the coils (not shown) is a second hollow housing 34. In this embodiment, the second hollow housing 34 is also common to the cores 16, 16'. One or more of such housings 30, 34 may contain electrical components 38.

Before the embodiment of Applicant's invention depicted in FIG. 12, the prior art had left unsolved the problems of isolating to the highest degree possible the output of respective transformer secondary windings. In the prior art, noise, hash, and other line disturbances can be transmitted from one secondary winding to another. By not sharing a common core, there is minimal transfer of unwanted disturbance from one secondary to another. Accordingly, if a device connected to the secondary of one transformer produces noise, there is minimal risk that any unwanted disturbance will be transmitted to adjacent secondary windings because such windings surround a separate core. In this manner, isolation of the cores and secondary windings is provided by the side-by-side transformers 14, 14'. Reference will be made later to a typical circuit diagram which represents this embodiment. Additional isolation may be provided by shielding between primary and secondary windings of one or more of the respective transformers.

Figure 13:
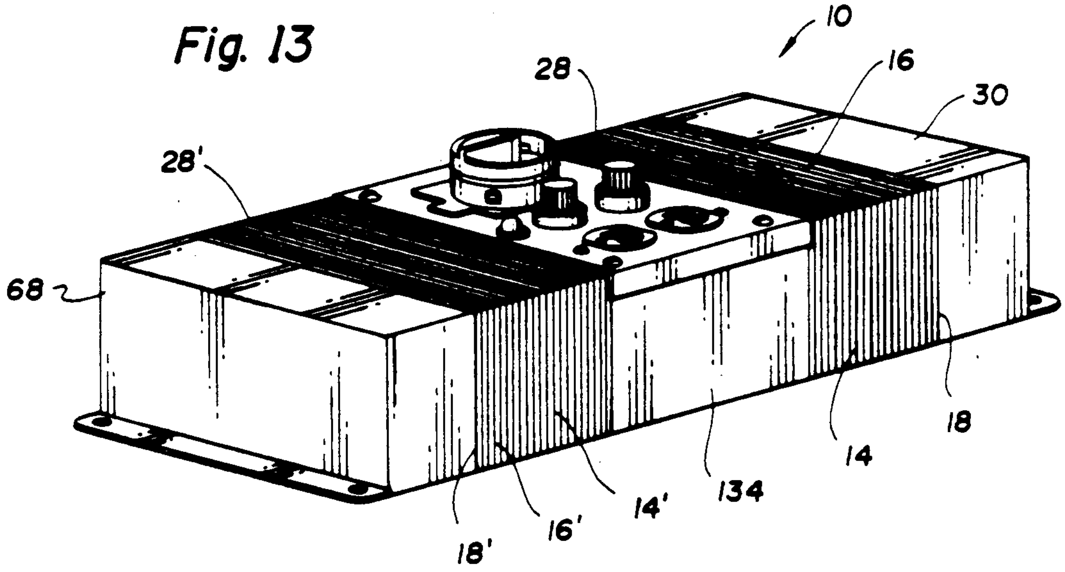
FIG. 13 is a perspective view of a third alternate embodiment of the transformer assembly.

Turning now to FIG. 13, there is shown another embodiment of the present invention in which the transformers 14, 14' are disposed in an end-to-end relationship, separated by a common housing 134.

In this configuration, there is a first hollow housing 30 attached to the core 16, which in turn is attached to a second hollow housing 134. On the opposite side of the housing 134, the second transformer 14' is provided. Finally, a third hollow housing 68 is attached to the opposite side of the transformer 14 from the housing 34. One or more of such housings 30, 34, 68 may contain electrical components 38.

The transformer assembly of FIG. 13 has the attribute of superior heat dissemination because it has a higher exposed surface area of transformer cores 16, 16' than the embodiment of FIG. 12. Additionally, the configuration of FIG. 13 can fit within relatively long and narrow spaces within a control panel, or in the channel of a building support. With continued reference to FIG. 13, it will readily be appreciated that the embodiment depicted therein also offers superior isolation characteristics between the transformers 14, 14'.

Figure 14:
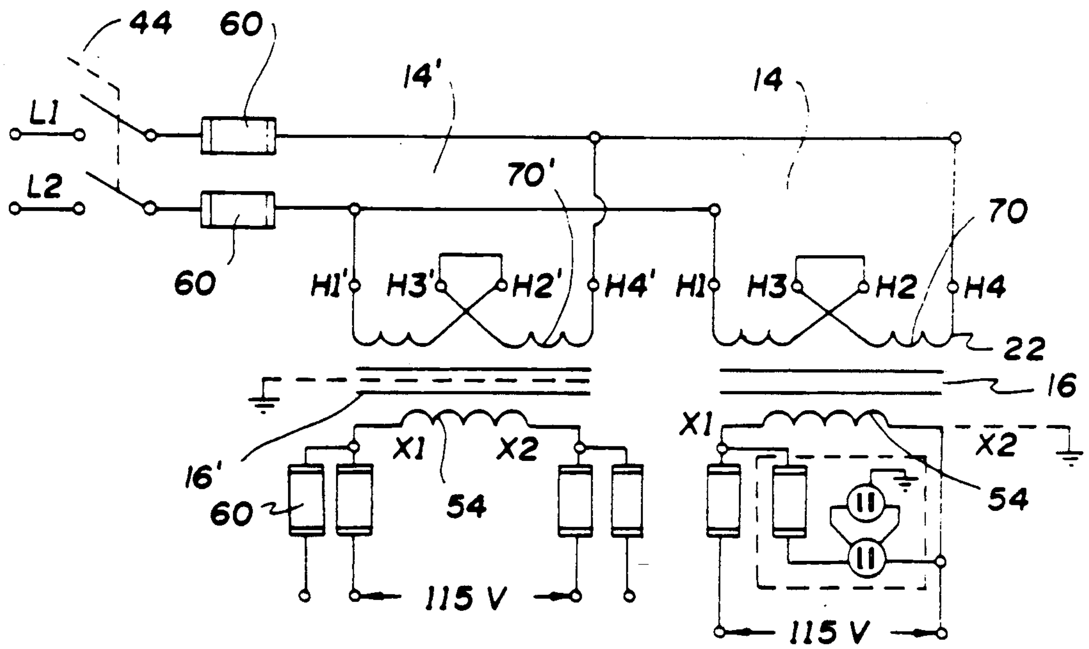
FIG. 14 is a schematic circuit diagram of the embodiments of the transformer assembly depicted in FIGS. 12 and 13.

FIG. 14 is a schematic circuit diagram of the transformer assemblies depicted in FIGS. 12 and 13. Lines L1 and L2 pass through the switching means 44, such as a rotary switch or a magnetic breaker switch as described earlier. Thereafter, each line passes through a fuse 60. The line L1 extends to primary windings 70, 70' on the transformers 14, 14'. Line L2 returns from the primary windings on each transformer. In FIG. 14, the primary windings include junctions H1'-H4' and H1-H4. Such windings may be included in a dual parallel winding, modifiable by jumper wires, which enables a change to be made from 240 to 480 volts.

FIG. 14 also depicts separate cores 16, 16', one of which 16', is shown by a dashed line as being shielded. As illustrated, the shielded core 16' is grounded. The shielding provides additional isolation beyond the isolation inherent in the disclosed transformer design. It has been found that shielding is helpful for powering any device which has, for example, sensitive computer chips or memories that might otherwise be disturbed by line feedback. Unshielded cores may be suitable, for example, for powering lights and a panel assembly.

Secondary windings 54, 54' are provided in facing relationship with the cores 16, 16'. Continuing with reference to FIG. 14, it is apparent that the lines or jumpers which extend between junctions H2' and H3', and H2 and H3 represent a dual parallel hook-up. Depending on how the jumpers are connected, 240 or 480 volts are received in the windings. This enables adjustment to be made so that 120 volts from the secondary is always produced regardless of whether the primary is 480 or 240 volts. In effect, the jumpers represent a means for lengthening or shortening the windings of the primaries 70, 70', thereby changing the electrical characteristics of the primary.

The secondary windings 54, 54' may have several taps. The winding 54' associated with the shielded core 16' may be used for such devices as a highly sensitive computer-related apparatus. While only two separate secondary connections are shown, it will readily be appreciated that there can be as many taps as desired. Separate devices can be associated with the secondary windings 54 of the other transformer 14. The secondary windings 54 are connected to fuses and duplex receptacles as described earlier for connections to lighting and other applications. It should be noted again that this secondary 54 is completely separate from the secondary 54' of the other transformer 14', thereby providing superior isolation characteristics.

Continuing with reference to FIG. 14, it will be apparent that there are depicted two separate transformers 14, 14' having a common line connection L1-L2. While each transformer has several taps on the secondaries 54, 54', there are in fact two separate transformers 14, 14'. This is quite unlike a dual secondary winding on the single core of a given transformer, in which electrical disturbance may transfer from one secondary winding to the other.

It will be apparent that the transformers 14, 14' depicted in FIG. 14 can be physically configured either in a side-by-side configuration (FIG. 12), or in an end-to-end configuration (FIG. 13).

In summary, it has been found that having two completely separated cores 16, 16' and associated secondaries 54, 54' provides a much higher quality delivery of power to a sensitive device. In the past, such problems were partially solved only by having two separate transformers. Until now, such problems have never been addressed by providing such transformers in an assembly with common housings and exposed cores, thereby enabling operations at high efficiency to be performed while retaining temperatures within acceptable limits, yet retaining the compactness of the transformer assembly.

Figure 15:
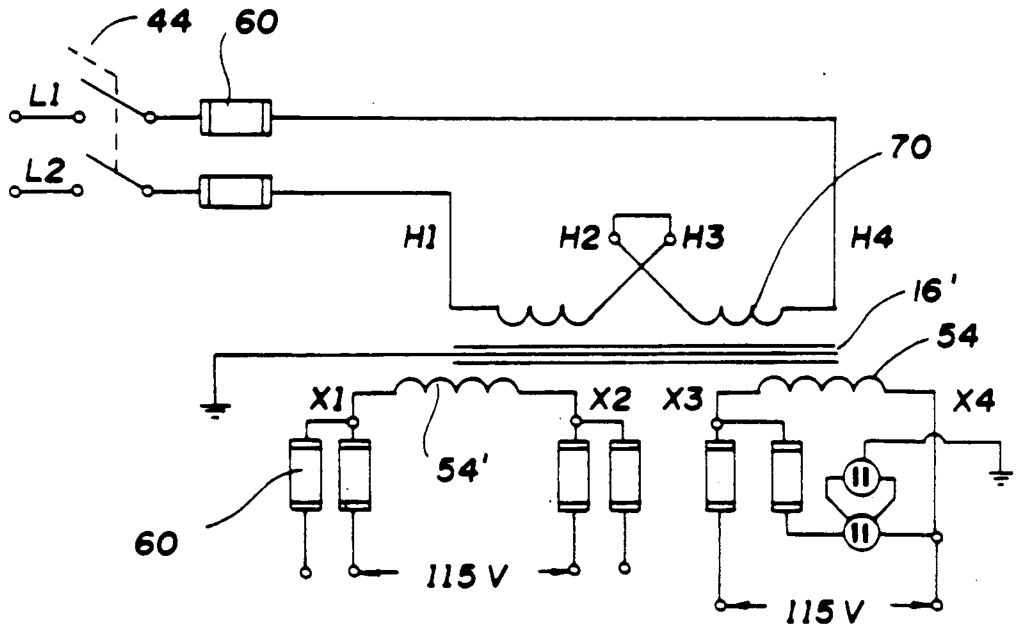
FIG. 15 is a schematic circuit diagram of another embodiment of the transformer assembly.

Turning now to FIG. 15, it will be realized that other configurations of Applicants' basic invention are possible. Such configurations include the provision of dual secondary windings 54, 54' which are electromagnetically associated with a single primary 70 and a single core 16'. Such a congfiguration provides the compactness of the disclosed transformer assembly without having to resort to providing two completely separate primary windings. The provision of dual secondaries completely isolated from each other, yet associated with a single core and a single primary provides a more compact assembly which is readily transported and can be accommodated within a relatively small space.

As shown, the core 16' depicted in FIG. 15 is shielded. It should be understood that the core of this embodiment need not be shielded or grounded and may be of the form 16 depicted in FIG. 14 which is neither shielded nor grounded.

The embodiment depicted in the view of FIG. 13 has three housings 30, 34, 68 and two transformers 14, 14' sandwiched therebetween. Lenghtwise extension of this basic concept is possible to accommodate the needs of specific electrical characteristics within the confines of spacial constraints. In general, if N is the number of transformers (two in FIG. 13), then N+1 will represent the number of housings (three in FIG. 13).

Similar observations are applicable to the embodiment as viewed in FIG. 12, in which the number of transformers 14, 14' (two in this example) equal the number of housings 30, 34. It will readily be appreciated that between the two common housings 30, 34, any number of transformers 14, 14' may be disposed in a side-by-side relationship.

Other variations are possible. These include the replacement, for example, of the transformer 14 in FIG. 13 by the adjacent transformers 14, 14' of FIG. 12.

Based on the foregoing disclosure, it will be apparent that the embodiments of the present invention provide considerable flexibility for providing several alternative configurations for providing isolated circuits. Each embodiment includes at least one transformer in an assembly with common housings and exposed cores.

While the best mode for carrying out the invention has been described in detail, those familiar with the art to which this invention relates will recognize various alternative designs and embodiments for practicing the invention as disclosed by the following claims.

What is claimed is:

1. A transformer assembly for providing a source of auxiliary electrical power independent of a main power supply, the transformer assembly comprising:

a plurality of transformers, each transformer having a core including a first side and a second side opposite thereto, and a coil including a first portion protruding outwardly from the first side of the core and a second portion protruding outwardly from the second side of the core, each core including lateral side edges extending between the first and second sides thereof for facilitating the removal of heat generated by the transformers;

a first hollow housing coupled, to the first side of at least one of the plurality of cores; and a second hollow housing coupled to the second side of at least one of the plurality of cores.

2. The transformer assembly of claim 1, further comprising:

a plurality of electrical components mounted at least partially within the first hollow housing to provide compact accommodation of the electrical components by the transformer assembly.

3. The transformer assembly of claim 1, further comprising:

a plurality of electrical components mounted at least partially within the second hollow housing to provide compact accommodation of the electrical components by the transformer assembly.

4. The transformer assembly of claim 1, further comprising:

a plurality of electrical components mounted at least partially within the first hollow housing and the second hollow housing to provide compact accommodation of electrical components by the transformer assembly.

5. The transformer assembly of claim 1, also including a container surrounding the plurality of transformers and the first and second hollow housings, the plurality of transformers and the hollow housings being mounted at least partially within the container, the container also having a plurality of electrical components mounted at least partially within the container substantially outside the plurality of transformers and the hollow housings, the container including the plurality of transformers, the hollow housings and the electrical components occupying a container volume [$V_1$].

6. The transformer assembly of any of claims 2-4, wherein the transformer assembly and the plurality of electrical components mounted at least partially within the one or more hollow housings occupies an assembly volume [$V_2$], where up to three (3) times the assembly volume [$V_2$] equals a container volume [$V_1$] occupied by a container surrounding the plurality of transformers, the hollow housings, and electrical components mounted at least partially within the container substantially outside the at least one transformer and the hollow housings, whereby economy in space utilization space results from mounting the electrical components at least partially within one or more of the hollow housings, rather than at least partially within the container.

7. The transformer assembly of any of claims 2-4, wherein one or more of the hollow housings includes a cover detachably connected to the associated hollow housing for access to the plurality of electrical components.

8. The transformer assembly of claim 7, wherein the plurality of electrical components comprises one or more means for switching for turning off the main power supply to the transformer assembly.

9. The transformer assembly of claim 8, wherein the one or more means for switching comprises one or more circuit breakers which cooperate with the associated cover so that the one or more circuit breakers turn off the main power supply for safety upon opening the associated cover.

10. The transformer assembly of claim 8, wherein the one or more means for switching comprise a rotary switch having a first and a second operating state, each rotary switch cooperating with the associated cover so that the associated rotary switch turns off the main power supply when in the first operating state or upon opening the associated cover.

11. The transformer assembly of claim 9, wherein the one or more circuit breakers each have a first and a second operating state, the transformer assembly further including means for locking the one or more circuit breakers in the first or the second operating state so that the main power supply can be turned off and the one or more circuit breakers secured in either operating state by the means for locking.

12. The transformer assembly of claim 10, wherein the one or more rotary switches cooperate with one or more of the plurality of electrical components mounted at least partially within the associated hollow housing so that the associated cover prohibits access into the associated hollow housing by a human operator when one or more of the rotary switches is in the second operating state and the main power supply is energized.

13. The transformer assembly of claim 9, wherein the transformer assembly further includes means for deactivating connected to the cover so that the one or more circuit breakers are tripped from the second to the first operating state for safety whenever the cover is opened.

14. The transformer assembly of claim 7, wherein the plurality of electrical components include one or more illumination devices which are visible outside the cover, the one or more illumination devices being activated when electrical current flows through the coil.

15. A transformer assembly for providing a source of auxiliary electrical power independent of a main power supply, the transformer assembly having an energy rating and comprising:

a plurality of transformers, each transformer having a core including a first side and a second side opposite thereto, and a coil including a first portion extending outwardly from the first side of the core and a second portion extending outwardly from the second side of the core, the core including lateral side edges extending a distance [D] between the first and second sides for facilitating the removal of heat generated by the transformer;

a first hollow housing coupled to the first side of at least one of the plurality of cores;

a second hollow housing coupled to the second side of at least one of the plurality of cores; and a plurality of electrical components mounted at least partially within one or more of the hollow housings to provide compact accommodation of electrical components by the transformer assembly, wherein the distance [D] between the first and second sides is the only dimension of the assembly which alters when the energy rating is changed by adding laminations to or removing laminations from the cores, thereby enabling transformer assemblies having different energy ratings to include first hollow housings of a given size to be attached to the cores and second hollow housings of a given size to be attached thereto, the assembly being received within a container of a fixed cross-sectional area for economical utilization of scarce ambient space, regardless of the energy rating of the assembly.

16. The transformer assembly of claim 15, wherein the plurality of electrical components mounted at least partially within the one or more hollow housings is selected from a group consisting of one or more illumination devices, receptacles, fuses, switches, shielding means, electrical noise protection means, surge protection means, ground fault protection means, and terminal blocks.

17. The transformer assembly of claim 15, wherein one or more of the plurality of electrical components are mounted completely within the associated hollow housing.

18. The transformer assembly of claim 15, wherein one or more of the plurality of electrical components are mounted through the associated hollow housing.

19. The transformer assembly of claim 15, wherein one or more of the plurality of electrical components are mounted on the associated hollow housing.

20. The transformer assembly of claim 1, wherein the plurality of transformers comprises two transformers.

21. The transformer assembly of claim 1, wherein the transformer assembly comprises two transformers.

22. The transformer assembly of claim 20, wherein the transformers are disposed in a side-by-side relationship to isolate the output of the associated coils, thereby minimizing the possibility of electrical disturbances between the coils of adjacent transformers.

23. A transformer assembly for providing a source of auxiliary electrical power independent from a main power supply, the transformer assembly comprising:

a first hollow housing;

a first transformer having a core including a first side coupled to the first hollow housing and a second side opposite thereto, the core including lateral side edges extending between the first and second sides for facilitating the removal of heat generated by the transformer;

a second housing coupled to the second side of the core of the first transformer;

a second transformer, the second transformer having a core including a first side coupled to the second housing and a second side opposite thereto, the core of the second transformer including lateral side edges extending between the first and second sides thereof for facilitating the removal of heat generated by the transformer; and a third hollow housing coupled to the second side of the core of the second transformer, wherein the possibility of electrical disturbances between the coils of the first and second transformers is minimized.

24. A transformer assembly for providing a source of auxiliary electrical power independent of a main power supply, the transformer assembly comprising:

a number N of transformers, where $N \geqq 2$, each of the N transformers having a core and a coil, each core including lateral side edges for facilitating the removal of heat generated by each transformer; and a number $N+1$ of hollow housings coupled to and on opposite sides of the cores.

25. A transformer assembly for providing a source of auxiliary electrical power independent of a main power supply, the transformer assembly comprising:

a number N of transformers, where $N \geqq 2$, each of the N transformers having a core and a coil, each core including lateral side edges for facilitating the removal of heat generated by each transformer; and a number N of hollow housings coupled to and on opposite sides of the cores.

* * * * *